US012604780B2

(12) United States Patent
Yamaguchi et al.

(10) Patent No.: US 12,604,780 B2
(45) Date of Patent: Apr. 14, 2026

(54) RADIO FREQUENCY MODULE AND COMMUNICATION DEVICE

(71) Applicant: Murata Manufacturing Co., Ltd., Kyoto (JP)

(72) Inventors: Yukiya Yamaguchi, Kyoto (JP); Takanori Uejima, Kyoto (JP); Motoji Tsuda, Kyoto (JP); Yuji Takematsu, Kyoto (JP); Shunji Yoshimi, Kyoto (JP); Satoshi Arayashiki, Kyoto (JP); Mitsunori Samata, Kyoto (JP); Satoshi Goto, Kyoto (JP); Masayuki Aoike, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 453 days.

(21) Appl. No.: 18/323,654

(22) Filed: May 25, 2023

(65) Prior Publication Data

US 2023/0299061 A1 Sep. 21, 2023

Related U.S. Application Data

(63) Continuation of application No. PCT/JP2021/042353, filed on Nov. 18, 2021.

(30) Foreign Application Priority Data

Dec. 11, 2020 (JP) ................................ 2020-206132

(51) Int. Cl.
*H10W 90/00* (2026.01)
*H10W 72/20* (2026.01)
*H10W 72/30* (2026.01)

(52) U.S. Cl.
CPC .......... *H10W 90/00* (2026.01); *H10W 72/222* (2026.01); *H10W 72/353* (2026.01); *H10W 90/724* (2026.01); *H10W 90/732* (2026.01)

(58) Field of Classification Search
None
See application file for complete search history.

(56) References Cited

U.S. PATENT DOCUMENTS

| | | | | | |
|---|---|---|---|---|---|
| 12,052,001 | B2 * | 7/2024 | Shinozaki | ............... | H03F 3/245 |
| 12,057,865 | B2 * | 8/2024 | Uejima | ................... | H04B 1/00 |

(Continued)

FOREIGN PATENT DOCUMENTS

| | | |
|---|---|---|
| JP | 2006-014030 A | 1/2006 |
| JP | 2014-146780 A | 8/2014 |

(Continued)

OTHER PUBLICATIONS

International Search Report for PCT/JP2021/042353 dated Feb. 8, 2022.

*Primary Examiner* — Idowu O Osifade
(74) *Attorney, Agent, or Firm* — McDonald Hopkins LLC

(57) ABSTRACT

A radio frequency module includes a module substrate having major surfaces that face each other, a first base part that is at least partially comprised of a first semiconductor material and in which an electronic circuit is formed, a second base part that is at least partially comprised of a second semiconductor material different from the first semiconductor material and in which a power amplifier is formed, and a switch connected to an output terminal of the power amplifier. The first base part is disposed on or over the major surface; the second base part is disposed between the module substrate and the first base part, is joined to the first base part, and is connected to the major surface via an electrode; and the switch is disposed on or over the major surface.

17 Claims, 7 Drawing Sheets

(56)  References Cited

U.S. PATENT DOCUMENTS

| 12,074,619 | B2 * | 8/2024 | Tomita | H04B 1/04 |
|---|---|---|---|---|
| 12,074,620 | B2 * | 8/2024 | Shinozaki | H04B 1/04 |
| 12,199,052 | B2 * | 1/2025 | Kitajima | H04B 1/38 |
| 12,250,017 | B2 * | 3/2025 | Nakagawa | H04B 1/40 |
| 2010/0210299 | A1 * | 8/2010 | Gorbachov | H04B 1/406 |
| | | | | 455/552.1 |
| 2014/0002188 | A1 | 1/2014 | Chen et al. | |
| 2014/0209926 | A1 | 7/2014 | Takatani et al. | |
| 2015/0221600 | A1 | 8/2015 | Wakabayashi | |
| 2017/0338847 | A1 | 11/2017 | Reisner et al. | |
| 2020/0395650 | A1 | 12/2020 | Onaka et al. | |
| 2021/0152202 | A1 | 5/2021 | Uejima | |
| 2021/0152210 | A1 | 5/2021 | Uejima | |
| 2021/0384926 | A1 * | 12/2021 | Nakajima | H04B 1/04 |

FOREIGN PATENT DOCUMENTS

| JP | 2015-527730 A | 9/2015 |
|---|---|---|
| WO | 2014/087792 A1 | 6/2014 |
| WO | 2019/167403 A1 | 9/2019 |
| WO | 2019/240095 A1 | 12/2019 |
| WO | 2019/240096 A1 | 12/2019 |

* cited by examiner

RADIO FREQUENCY MODULE AND COMMUNICATION DEVICE

CROSS REFERENCE TO RELATED APPLICATION

This is a continuation of International Application No. PCT/JP2021/042353 filed on Nov. 18, 2021 which claims priority from Japanese Patent Application No. 2020-206132 filed on Dec. 11, 2020. The contents of these applications are incorporated herein by reference in their entireties.

BACKGROUND ART

Technical Field

The present disclosure relates to a radio frequency module and a communication device.

In a mobile communication device, such as a mobile phone, the layout of circuit elements constituting a radio-frequency front-end circuit has become complex along with the increasing use of multiband technology.

Patent Document 1 discloses a radio frequency module including a power amplifier and a controller that are arranged on a package substrate. In the radio frequency module disclosed in Patent Document 1, the power amplifier and the controller are stacked to reduce the size of the radio frequency module.

Patent Document 1: U.S. Patent Application Publication No. 2017/0338847

BRIEF SUMMARY

However, along with the increasing use of multiband technology in mobile communication, the number of circuit components, such as switches, has increased, and it has become difficult to further reduce the size of a radio frequency module solely by the related-art technology.

In view of the above problem, the present disclosure provides a reduced-size, multiband radio frequency module and a reduced-size, multiband communication device.

A radio frequency module according to an aspect of the present disclosure includes a module substrate having a first major surface and a second major surface that face each other, a first base part that is at least partially comprised of a first semiconductor material and in which an electronic circuit is formed, a second base part that is at least partially comprised of a second semiconductor material different from the first semiconductor material and in which a power amplifier is formed, and a first switch connected to an input terminal or an output terminal of the power amplifier. The first base part is disposed on or over the first major surface; the second base part is disposed between the module substrate and the first base part, is joined to the first base part, and is connected to the first major surface via a first electrode; and the first switch is disposed on or over the second major surface.

The present disclosure makes it possible to provide a reduced-size, multiband radio frequency module and a reduced-size, multiband communication device.

DETAILED DESCRIPTION

Figure 1:
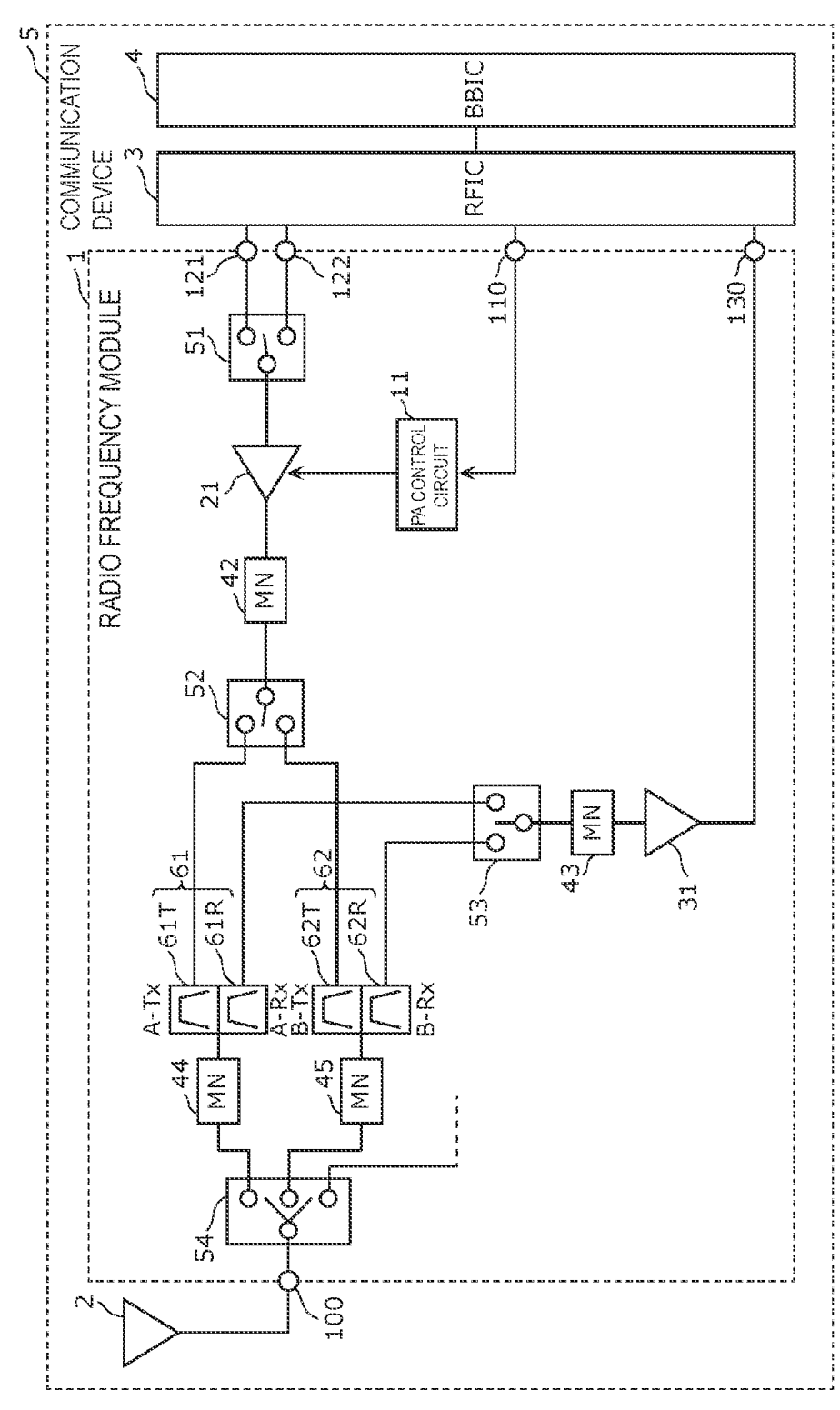
FIG. 1 is a circuit diagram of a radio frequency module and a communication device according to an embodiment.

Embodiments of the present disclosure are described below in detail. Each of the embodiments described below represents a general or specific example. Values, shapes, materials, components, and layouts and connection configurations of the components described in the embodiments below are just examples and are not intended to limit the present disclosure. Among the components described in the examples below, components not recited in independent claims are optional components. Also, the sizes or the ratios of sizes of components illustrated in the drawings are not necessarily accurate. In the drawings, the same reference number is assigned to substantially the same components, and overlapping descriptions of those components are omitted or simplified.

Also, in the descriptions below, terms such as "parallel" and "perpendicular" indicating relationships between elements, terms such as "rectangular" indicating shapes of elements, and numerical ranges do not only indicate their exact meanings but may also indicate substantially equivalent ranges that vary by, for example, about a few percent.

In the descriptions below, "A is disposed on a first major surface of a substrate" not only indicates that A is directly mounted on the first major surface but also indicates that, out of a space over the first major surface and a space over a second major surface that are separated by the substrate, A is disposed in the space over the first major surface. That is, the above expression includes a case in which A is mounted on the first major surface via other elements such as a circuit element and an electrode.

Also, in a circuit configuration in this disclosure, "connected" indicates not only a case in which a circuit component is directly connected using a connection terminal and/or a wire conductor but also indicates a case in which a circuit component is electrically connected via another circuit component. Furthermore, "connected between A and B" indicates that a component is disposed between A and B and is connected to both of A and B.

In each of the drawings below, an x-axis and a y-axis are orthogonal to each other in a plane that is parallel to the major surface of a module substrate. Also, a z-axis is perpendicular to the major surface of the module substrate, a positive z-axis direction indicates an upward direction, and a negative z-axis direction indicates a downward direction.

Also, in a module configuration of this disclosure, "plan view" indicates a view of an object that is orthographically projected onto an xy plane from the positive z-axis side. "A component is disposed on a major surface of a substrate" indicates, in addition to a case in which the component is disposed on and in contact with the major surface of the substrate, a case in which the component is disposed above and not in contact with the major surface and a case in which the component is partially embedded in the major surface of the substrate.

In the descriptions below, when A, B, and C are mounted on or over a substrate, "C is disposed between A and B in plan view of the substrate (or the major surface of the substrate)" indicates that at least one of multiple line segments connecting given points in A to given points in B passes through the region of C in plan view of the substrate. Also, a plan view of a substrate indicates a view of the substrate and circuit elements mounted on or over the substrate that are orthographically projected onto a plane parallel to the major surface of the substrate.

In the descriptions below, "transmission path" indicates a transmission line constituted by wires through which radio-frequency transmission signals propagate, electrodes directly connected to the wires, and terminals directly connected to the wires or the electrodes. Also, "reception path" indicates a transmission line constituted by, for example, wires through which radio-frequency reception signals propagate, electrodes directly connected to the wires, and terminals directly connected to the wires or the electrodes.

Embodiment

1. Circuit Configurations of Radio Frequency Module 1 and Communication Device 5

FIG. 1 is a circuit diagram of a radio frequency module 1 and a communication device 5 according to an embodiment. As illustrated in FIG. 1, the communication device 5 includes the radio frequency module 1, an antenna 2, an RF signal processing circuit (RFIC) 3, and a baseband signal processing circuit (BBIC) 4.

The RFIC 3 is an RF signal processing circuit that processes radio frequency signals sent and received via the antenna 2. Specifically, the RFIC 3 performs signal processing, such as down converting, on a reception signal input via a reception path of the radio frequency module 1 and outputs a reception signal generated by the signal processing to the BBIC 4. Also, the RFIC 3 outputs a radio-frequency transmission signal processed based on a signal input from the BBIC 4 to a transmission path of the radio frequency module 1.

The BBIC 4 performs data processing by using a signal with a frequency lower than the frequency of a radio frequency signal transmitted through the radio frequency module 1. For example, a signal processed by the BBIC 4 is used as an image signal for displaying an image or as a voice signal for a call via a speaker.

The RFIC 3 also functions as a control unit that controls the connections of switches 51, 52, 53, and 54 of the radio frequency module 1 based on a communication band (frequency band) being used. Specifically, the RFIC 3 changes the connections of the switches 51-54 of the radio frequency module 1 according to a control signal (not shown). The control unit may instead be provided outside of the RFIC 3 and may be provided in, for example, the radio frequency module 1 or the BBIC 4.

The RFIC 3 also functions as a control unit that controls the gain of a power amplifier 21 of the radio frequency module 1 and a power supply voltage Vcc and a bias voltage Vbias that are supplied to the power amplifier 21. Specifically, the RFIC 3 outputs digital control signals to a control signal terminal 110 of the radio frequency module 1. A PA control circuit 11 adjusts the gain of the power amplifier 21 by outputting a control signal and the power supply voltage Vcc or the bias voltage Vbias to the power amplifier 21 according to the digital control signals input via the control signal terminal 110. Here, a control signal terminal that receives, from the RFIC 3, a digital control signal for controlling the gain of the power amplifier 21 and a control signal terminal that receives, from the RFIC 3, a digital control signal for controlling the power supply voltage Vcc and the bias voltage Vbias supplied to the power amplifier 21 may be different from each other.

The antenna 2 is connected to an antenna connection terminal 100 of the radio frequency module 1, emits a radio frequency signal output from the radio frequency module 1, receives a radio frequency signal from the outside, and outputs the received radio frequency signal to the radio frequency module 1.

In the communication device 5 according to the present embodiment, the antenna 2 and the BBIC 4 are optional components.

Next, a detailed configuration of the radio frequency module 1 is described.

As illustrated in FIG. 1, the radio frequency module 1 includes the antenna connection terminal 100, transmission input terminals 121 and 122, a reception output terminal 130, the power amplifier 21, the control signal terminal 110, the PA control circuit 11, a low-noise amplifier 31, transmission filters 61T and 62T, reception filters 61R and 62R, matching circuits 42, 43, 44, and 45, and the switches 51, 52, 53, and 54.

The antenna connection terminal 100 is an antenna common terminal connected to the antenna 2.

The power amplifier 21 is an amplifier circuit that amplifies radio frequency signals that are in a first communication band and a second communication band and are input from the transmission input terminals 121 and 122. The power amplifier 21 is included in a second base part 20. The second base part 20 is at least partially comprised of, for example, GaAs. The power amplifier 21 includes, for example, a heterojunction bipolar transistor (HBT).

The PA control circuit 11 is an example of a control circuit that adjusts the gain of the power amplifier 21 according to, for example, a digital control signal input via the control signal terminal 110. The PA control circuit 11 is included in a first base part 10 and is comprised of, for example, a complementary metal oxide semiconductor (CMOS). Specifically, the PA control circuit 11 is formed by a silicon-on-insulator (SOI) process. This makes it possible to manufacture the PA control circuit 11 at low cost. The first base part 10 is at least partially comprised of, for example, Si.

The low-noise amplifier 31 amplifies radio frequency signals in a communication band A and a communication band B with low noise and outputs the amplified radio frequency signals to the reception output terminal 130.

The transmission filter 61T is an example of a first transmission filter, is disposed in a transmission path connecting the power amplifier 21 to the antenna connection terminal 100, and transmits a transmission signal in a transmission band of the communication band A among transmission signals amplified by the power amplifier 21. The transmission filter 62T is an example of a second transmission filter, is disposed in a transmission path connecting the power amplifier 21 to the antenna connection terminal 100, and transmits a transmission signal in a transmission band of the communication band B among transmission signals amplified by the power amplifier 21.

The reception filter 61R is disposed in a reception path connecting the low-noise amplifier 31 to the antenna connection terminal 100 and transmits a reception signal in a reception band of the communication band A among reception signals input from the antenna connection terminal 100. The reception filter 62R is disposed in a reception path connecting the low-noise amplifier 31 to the antenna connection terminal 100 and transmits a reception signal in a reception band of the communication band B among reception signals input from the antenna connection terminal 100.

The transmission filter 61T and the reception filter 61R constitute a duplexer 61 with a pass band corresponding to the communication band A. Also, the transmission filter 62T and the reception filter 62R constitute a duplexer 62 with a pass band corresponding to the communication band B.

Each of the duplexers 61 and 62 may also be implemented by one filter that transmits signals according to time division duplex (TDD). In this case, a switch for switching between transmission and reception is provided at least before or after the one filter.

The matching circuit 42 is disposed in a transmission path connecting the power amplifier 21 to the transmission filters 61T and 62T and provides impedance matching between the power amplifier 21 and the transmission filters 61T and 62T.

The matching circuit 43 is disposed in a reception path connecting the low-noise amplifier 31 to the reception filters 61R and 62R and provides impedance matching between the low-noise amplifier 31 and the reception filters 61R and 62R.

The matching circuit 44 is disposed in a path connecting the switch 54 to the duplexer 61 and provides impedance matching between the combination of the antenna 2 and the switch 54 and the duplexer 61. The matching circuit 45 is disposed in a path connecting the switch 54 to the duplexer 62 and provides impedance matching between the combination of the antenna 2 and the switch 54 and the duplexer 62.

The switch 51 is an example of a first switch and includes a common terminal and two selection terminals. The common terminal of the switch 51 is connected to an input terminal of the power amplifier 21. One of the selection terminals of the switch 51 is connected to the transmission input terminal 121, and the other one of the selection terminals of the switch 51 is connected to the transmission input terminal 122. That is, the switch 51 is connected to the input terminal of the power amplifier 21, and connects and disconnects the transmission input terminal 121 to and from the input terminal. Also, the switch 51 is connected to the input terminal of the power amplifier 21, and connects and disconnects the transmission input terminal 122 to and from the input terminal. The switch 51 is implemented by, for example, a single-pole double-throw (SPDT) switch circuit.

For example, a transmission signal in the communication band A is input from the transmission input terminal 121, and a transmission signal in the communication band B is input from the transmission input terminal 122.

Also, for example, a transmission signal in the communication band A or B in the fourth generation mobile communication system (4G) may be input from the transmission input terminal 121, and a transmission signal in the communication band A or B in the fifth generation mobile communication system (5G) may be input from the transmission input terminal 122.

The switch 51 may also be configured such that the common terminal is connected to one of the transmission input terminals, one of the selection terminals is connected to a first power amplifier that amplifies a transmission signal in the communication band A, and the other one of the selection terminals is connected to a second power amplifier that amplifies a transmission signal in the communication band B.

Also, the switch 51 may be implemented by a double-pole double-throw (DPDT) switch circuit including two common terminals and two selection terminals. In this case, the transmission input terminal 121 is connected to one of the common terminals, and the transmission input terminal 122 is connected to the other one of the common terminals. Also, one of the selection terminals is connected to the first power amplifier that amplifies a transmission signal in the communication band A, and the other one of the selection terminals is connected to the second power amplifier that amplifies a transmission signal in the communication band B. In this connection configuration, the switch 51 selects one of the connection between the one of the common terminals and the one of the selection terminals and the connection between the one of the common terminals and the other one of the selection terminals, and selects one of the connection between the other one of the common terminals and the one of the selection terminals and the connection between the other one of the common terminals and the other one of the selection terminals.

In this case, for example, a transmission signal in the communication band A is input from the transmission input terminal 121 and a transmission signal in the communication band B is input from the transmission input terminal 122. As another example, transmission signals in the communication band A and the communication band B in 4G may be input from the transmission input terminal 121, and transmission signals in the communication band A and the communication band B in 5G may be input from the transmission input terminal 122.

The switch 52 is an example of a first switch and includes a common terminal and two selection terminals. The common terminal of the switch 52 is connected to an output terminal of the power amplifier 21 via the matching circuit 42. One of the selection terminals of the switch 52 is connected to the transmission filter 61T, and the other one of the selection terminals of the switch 52 is connected to the transmission filter 62T. That is, the switch 52 is connected between the output terminal of the power amplifier 21 and the transmission filters 61T and 62T, and selects one of the connection between the output terminal and the transmission filter 61T and the connection between the output terminal and the transmission filter 62T. The switch 52 is implemented by, for example, an SPDT switch circuit.

The switch 53 includes a common terminal and two selection terminals. The common terminal of the switch 53 is connected to an input terminal of the low-noise amplifier 31 via the matching circuit 43. One of the selection terminals of the switch 53 is connected to the reception filter 61R, and the other one of the selection terminals of the switch 53 is connected to the reception filter 62R. In this connection configuration, the switch 53 selects one of the connection between the common terminal and one of the selection terminals and the connection between the common terminal and the other one of the selection terminals. In other words, the switch 53 selects one of the connection between the low-noise amplifier 31 and a reception path for transmitting a reception signal in the communication band A and the connection between the low-noise amplifier 31 and a reception path for transmitting a reception signal in the communication band B. The switch 53 is implemented by, for example, an SPDT switch circuit.

The switch 54 is an example of an antenna switch, is connected to the antenna connection terminal 100, and selects one of (1) the connection between the antenna connection terminal 100 and a signal path for transmitting a transmission signal and a reception signal in the communication band A and (2) the connection between the antenna connection terminal 100 and a signal path for transmitting a transmission signal and a reception signal in the communication band B. The switch 54 may also be a multi-connection switch circuit capable of establishing the connections (1) and (2) simultaneously.

Also, a multiplexer may be provided between the switch 54 and the antenna connection terminal 100.

Each of the transmission filters 61T and 62T and the reception filters 61R and 62R may be implemented by, for example, but is not limited to, an acoustic wave filter using a surface acoustic wave (SAW), an acoustic wave filter using a bulk acoustic wave (BAW), an LC resonant filter, or a dielectric filter.

Each of the power amplifier 21 and the low-noise amplifier 31 is comprised of, for example, an Si-based CMOS, or a field-effect transistor (FET) or a hetero-bipolar transistor (HBT) including GaAs.

The low-noise amplifier 31 and the switches 53 and 54 may also be integrated into one semiconductor IC. The semiconductor IC may be implemented by, for example, a CMOS. Specifically, the semiconductor IC is formed by an SOI process. This makes it possible to manufacture the semiconductor IC at a low cost. The semiconductor IC may be comprised of at least one of GaAs, SiGe, and GaN. This makes it possible to output a radio frequency signal with high-quality amplification performance and noise performance.

With the above circuit configuration, the radio frequency module 1 can independently transmit, receive, or transmit and receive either one of a radio frequency signal in the communication band A and a radio frequency signal in the communication band B. Furthermore, the radio frequency module 1 can perform at least one of simultaneous transmission, simultaneous reception, and simultaneous transmission and reception of a radio frequency signal in the communication band A and a radio frequency signal in the communication band B.

Among the circuit components and the circuit elements illustrated in FIG. 1, the radio frequency module 1 according to the present embodiment needs to include at least the power amplifier 21 and the switch 51 or 52.

Here, along with the increasing use of multiband technology in mobile communication, the number of circuit components of a radio frequency module has increased, and it has become difficult to reduce the size of a radio frequency module.

In view of this problem, a configuration of a reduced-size, multiband radio frequency module 1 is described below.

Figures 2A, 2B:
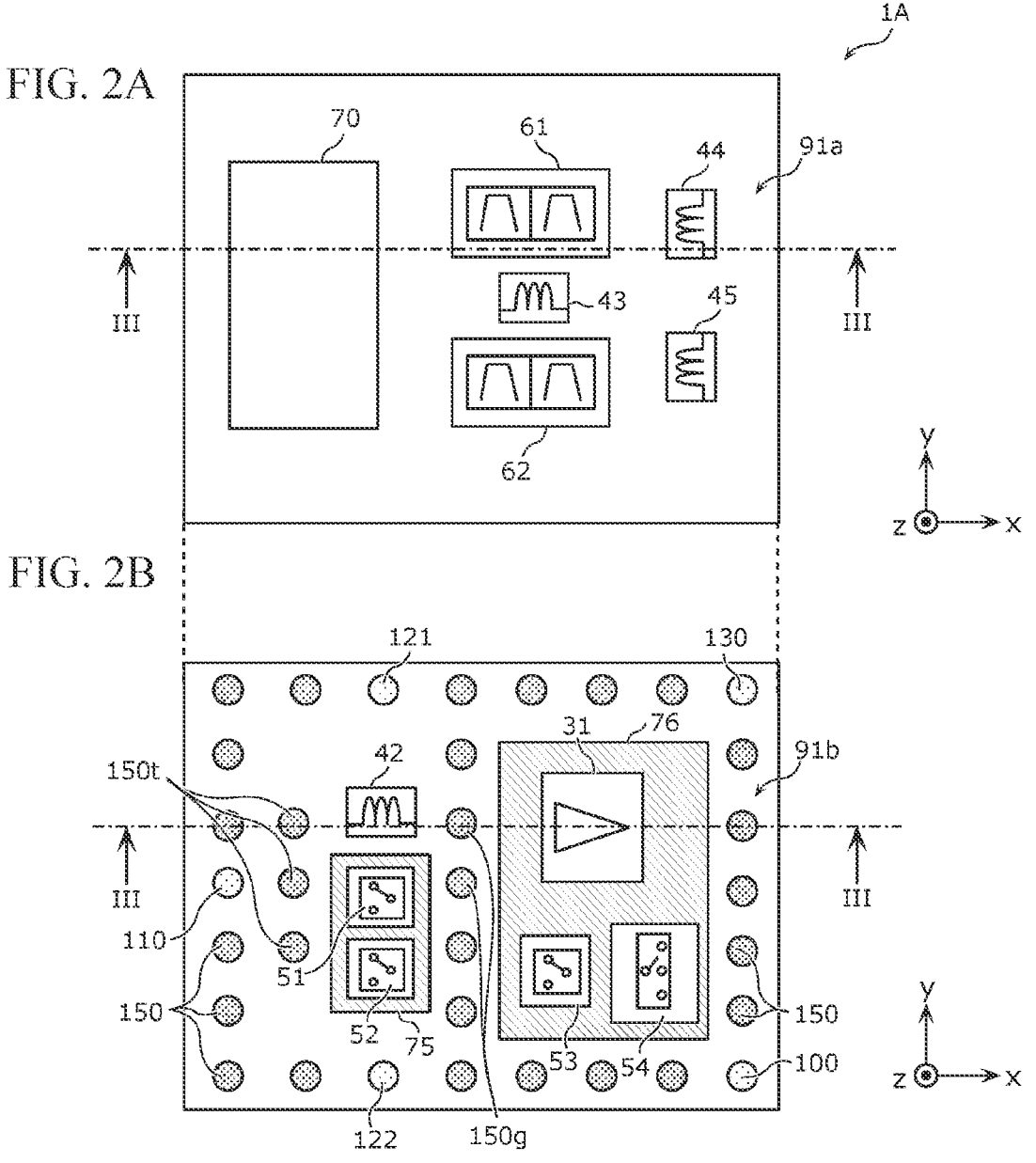
FIG. 2A is a plan-view schematic diagram of a major surface of a radio frequency module according to a first example viewed from the positive z-axis direction.
FIG. 2B is a transparent view of another major surface of the radio frequency module according to the first example when the another major surface is viewed from the positive z-axis direction
Figure 3:
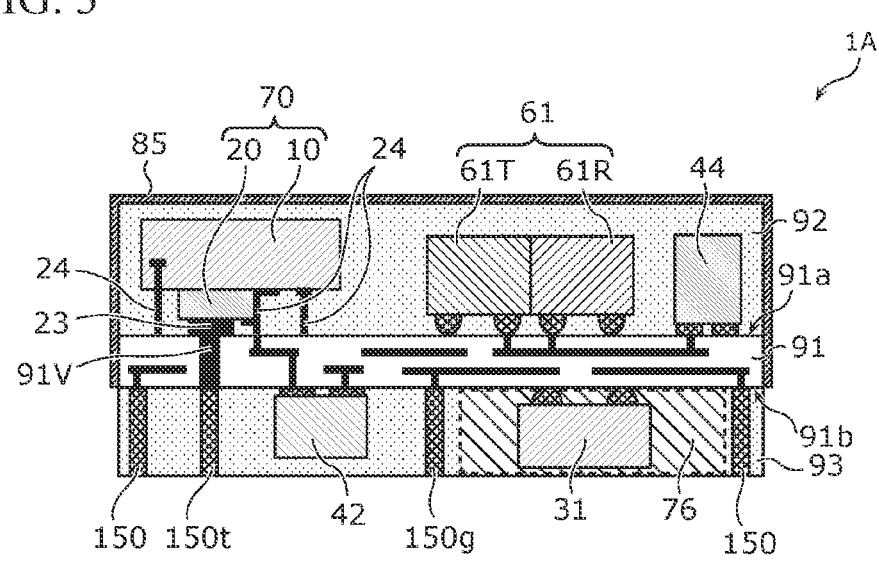
FIG. 3 is a cross-sectional schematic diagram of the radio frequency module according to the first example.

2. Layout of Circuit Elements of Radio Frequency Module 1A According to First Example FIG. 2A is a plan-view schematic diagram of a major surface of a radio frequency module 1A according to a first example. FIG. 2B is a transparent view of another major surface of the radio frequency module 1A according to the first example viewed from the positive z-axis direction. FIG. 3 is a cross-sectional schematic diagram of the radio frequency module 1A according to the first example and is specifically a cross-sectional view taken along line III-III of FIGS. 2A and 2B. A module substrate 91 has major surfaces 91a and 91b, and FIG. 2A illustrates a layout of circuit components when the major surface 91a is viewed from the positive z-axis direction. On the other hand, FIG. 2B is a transparent view of the layout of circuit components when the major surface 91b is viewed from the positive z-axis direction. Although circuit components in FIGS. 2A and 2B are provided with symbols representing their functions to facilitate the understanding of the layout of the circuit components, such symbols are not provided in the actual radio frequency module 1A.

The radio frequency module 1A according to the first example shows a specific example of the layout of circuit elements constituting the radio frequency module 1 according to the embodiment.

As illustrated in FIGS. 2A, 2B, and 3, the radio frequency module 1A according to this example includes, in addition to the circuit configuration illustrated in FIG. 1, the module substrate 91, resin components 92 and 93, external connection terminals 150, a metal shield layer 85, and a semiconductor IC 70.

The semiconductor IC 70 includes the power amplifier 21 and the PA control circuit 11 illustrated in FIG. 1.

The module substrate 91 has the major surface 91a and the major surface 91b that face each other, and circuit components constituting the radio frequency module 1A are mounted on or over the module substrate 91. The module substrate 91 is implemented by, for example, a low temperature co-fired ceramics (LTCC) substrate with a multilayer structure formed of multiple dielectric layers, a high temperature co-fired ceramics (HTCC) substrate, a component built-in substrate, a substrate including a redistribution layer (RDL), or a printed-circuit board.

In this example, the major surface 91a corresponds to a first major surface, and the major surface 91b corresponds to a second major surface.

As illustrated in FIG. 2B, the antenna connection terminal 100, the control signal terminal 110, the transmission input terminals 121 and 122, and the reception output terminal 130 may be formed on the major surface 91b.

The resin component 92 is disposed on the major surface 91a and covers parts of the circuit components constituting the radio frequency module 1A and the major surface 91a. The resin component 93 is disposed on the major surface 91b and covers parts of the circuit components constituting the radio frequency module 1A and the major surface 91b. Each of the resin components 92 and 93 has a function to secure the reliability in, for example, the mechanical strength and the moisture resistance of the circuit components constituting the radio frequency module 1A. Here, the resin components 92 and 93 are optional components of the radio frequency module 1 according to the present embodiment.

In this example, each of the matching circuits 42, 43, 44, and 45 includes an inductor.

As illustrated in FIGS. 2A, 2B, and 3, in the radio frequency module 1A according to this example, the semiconductor IC 70, the duplexers 61 and 62, and the matching circuits 43, 44, and 45 are disposed on or over the major surface 91a. In contrast, the low-noise amplifier 31, the switches 51 to 54, and the matching circuit 42 are disposed on or over the major surface 91b.

Also, although not illustrated in FIGS. 2A and 2B, wires illustrated in FIG. 1 and connecting the circuit components are formed inside of the module substrate 91 and on the major surfaces 91*a* and 91*b*. Each of the wires may be a bonding wire the ends of which are connected to one of the major surfaces 91*a* and 91*b* and one of the circuit components constituting the radio frequency module 1A, or the wires may be terminals, electrodes, or wires formed on the surfaces of the circuit components constituting the radio frequency module 1A.

Also, in the radio frequency module 1A according to this example, multiple external connection terminals 150 are disposed on the major surface 91*b*. The radio frequency module 1A exchanges electric signals, via multiple external connection terminals 150, with an external substrate disposed to face the radio frequency module 1A from the negative z-axis direction. Also, some of the multiple external connection terminals 150 are set at the ground potential of the external substrate. Out of the major surfaces 91*a* and 91*b*, on the major surface 91*b* facing the external substrate, circuit components, the heights of which cannot be easily reduced, are not mounted. Instead, the low-noise amplifier 31 and the switches 51 to 54, the heights of which can be easily reduced, are mounted on the major surface 91*b*. In the radio frequency module 1A according to this example, the inductor of the matching circuit 42 may be, for example, an integrated passive device (IPD) that is integrated and mounted inside of or on the surface of an Si substrate. With this configuration, because the inductor of the matching circuit 42 is implemented by an IPD the height of which can be reduced, it is possible to reduce the height of the radio frequency module 1A on the side of the major surface 91*b*.

The external connection terminals 150 may be columnar electrodes that pass through the resin component 93 in the z-axis direction as illustrated in FIGS. 2A, 2B, and 3. Alternatively, the external connection terminals 150 may be bump electrodes formed on the major surface 91*b*. In this case, the resin component 93 on the major surface 91*b* may be omitted.

In the radio frequency module 1A according to this example, it is suitable that the semiconductor IC 70 be disposed on or over the major surface 91*a* and at least one of the switches 51 and 52 be disposed on the major surface 91*b*, whereas other circuit components may be disposed on or over either one of the major surfaces 91*a* and 91*b*.

The semiconductor IC 70 includes the first base part 10 and the second base part 20.

The first base part 10 is at least partially comprised of a first semiconductor material, and an electronic circuit is formed in the first base part 10. The PA control circuit 11 is an example of the electronic circuit. The first semiconductor material is, for example, an element semiconductor such as silicon (Si) or gallium nitride (GaN). That is, in this example, the first base part 10 is at least partially comprised of Si or GaN, and the PA control circuit 11 is formed in the first base part 10. The first semiconductor material is not limited to silicon or gallium nitride. For example, the first semiconductor material may be, but is not limited to, a material including any one of gallium arsenide, aluminum arsenide (AlAs), indium arsenide (InAs), indium phosphide (InP), gallium phosphide (GaP), indium antimonide (InSb), gallium nitride, indium nitride (InN), aluminum nitride (AlN), silicon, germanium (Ge), silicon carbide (SiC), and gallium oxide (III) (Ga₂O₃), or may be a multi-component mixed crystal material including two or more of these substances.

The second base part 20 is at least partially comprised of a second semiconductor material different from the first semiconductor material, and an amplifier circuit is formed in the second base part 20. The power amplifier 21 is an example of the amplifier circuit. The second semiconductor material is, for example, a compound semiconductor such as gallium arsenide (GaAs) or silicon germanium (SiGe). That is, in this example, the second base part 20 is at least partially comprised of GaAs or SiGe, and the power amplifier 21 is formed in the second base part 20. The second semiconductor material is not limited to gallium arsenide or silicon germanium. For example, the second semiconductor material may be, but is not limited to, a material including any one of gallium arsenide, aluminum arsenide, indium arsenide, indium phosphide, gallium phosphide, indium antimonide, gallium nitride, indium nitride, aluminum nitride, silicon germanium, silicon carbide, gallium oxide (III), and gallium bismuth (GaBi), or may be a multi-component mixed crystal material including two or more of these substances.

As illustrated in FIG. 3, the second base part 20 is disposed between the module substrate 91 and the first base part 10, joined to the first base part 10, and connected to the major surface 91*a* via an electrode 23.

With the above configuration, the semiconductor IC 70 is disposed on or over the major surface 91*a*, and the switches 51 and 52 are disposed on or over the major surface 91*b*. With this configuration, the circuit components constituting the radio frequency module 1A are distributed to the two sides of the module substrate 91, and therefore, the size of the radio frequency module 1A can be reduced.

As illustrated in FIGS. 2A, 2B and 3, in plan view of the module substrate 91, the semiconductor IC 70 and the switches 51 and 52 at least partially overlap each other.

Compared with a configuration in which the semiconductor IC 70 and the switches 51 and 52 are disposed on or over the same major surface of the module substrate 91, the above configuration makes it possible to shorten control wiring connecting the PA control circuit 11 formed in the first base part 10 to the switches 51 and 52 and to shorten transmission signal wiring connecting the power amplifier 21 to the switches 51 and 52, and thereby makes it possible to reduce the transmission loss of transmission signals and control signals.

At least one of the first base part 10 and the second base part 20 may overlap at least one of the switches 51 and 52. This makes it possible to shorten at least one of the control wiring and the transmission signal wiring and thereby makes it possible to reduce the transmission loss in the radio frequency module 1A.

The semiconductor IC 70 is described in detail below. As described above, the semiconductor IC 70 includes the first base part 10 and the second base part 20.

Figure 4:
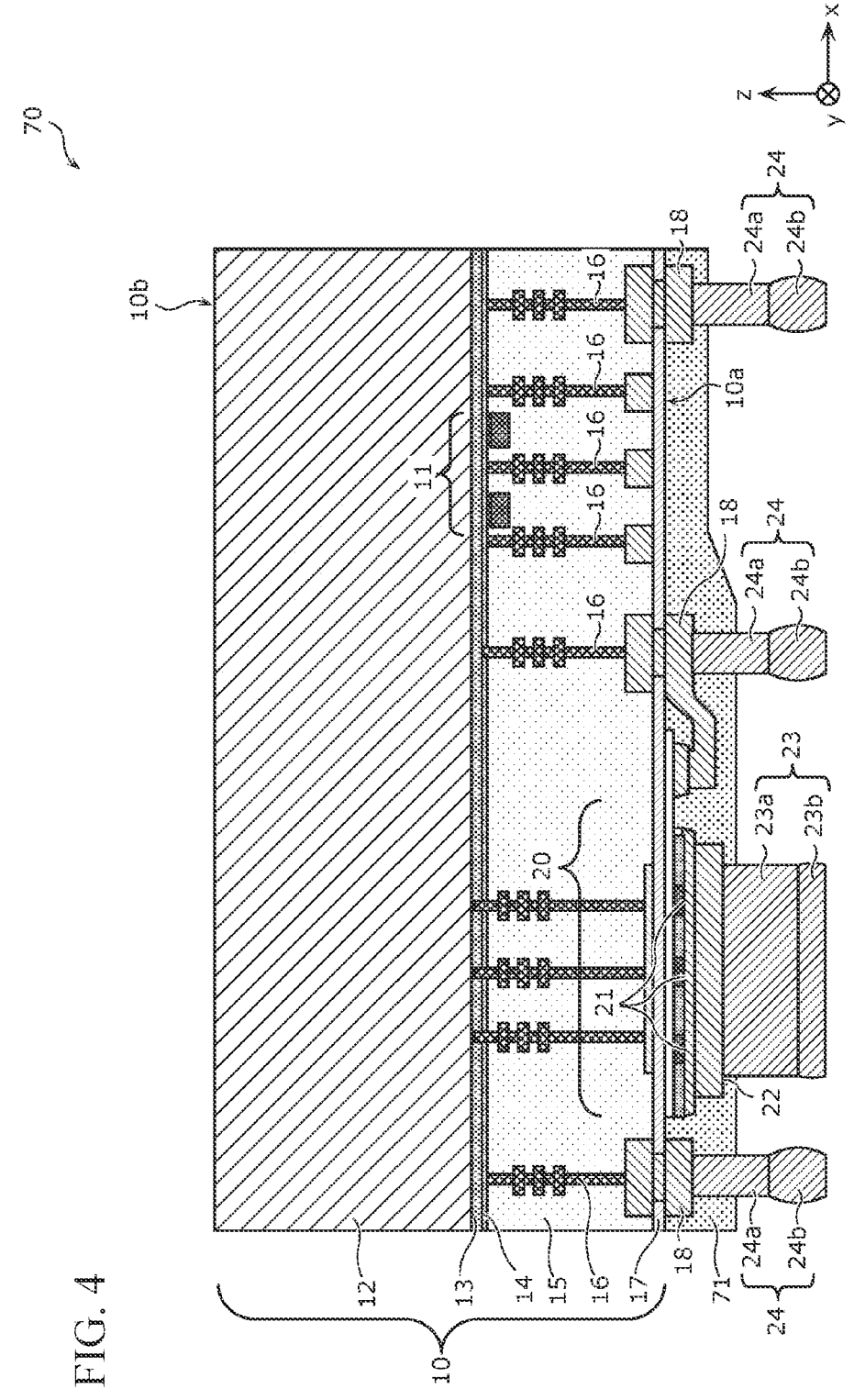
FIG. 4 is a cross-sectional view of a semiconductor IC according the first example.
Figure 5:
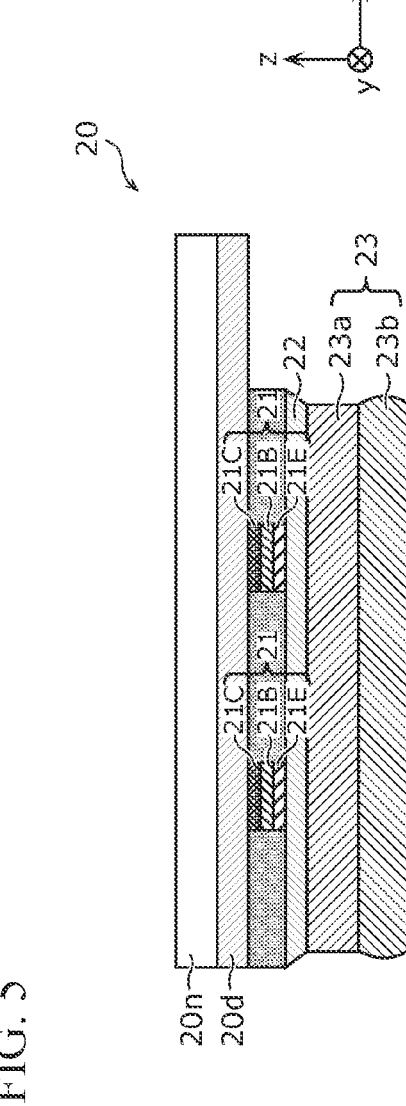
FIG. 5 is a cross-sectional view of a second base part according to the first example.

FIG. 4 is a cross-sectional view of the semiconductor IC 70 according the first example. FIG. 5 is a cross-sectional view of the second base part 20 according to the first example.

As illustrated in FIG. 4, the first base part 10 and the second base part 20 are stacked in the z-axis direction (a direction perpendicular to the major surface 91*a*).

The first base part 10 includes, for example, an Si substrate 12, an insulating layer 13, an Si layer 14, a wiring layer 15, and an SiN layer 17. The SiN layer 17, the wiring layer 15, the Si layer 14, the insulating layer 13, and the Si substrate 12 are stacked from the major surface 91*a* in this order.

The Si substrate 12 is comprised of, for example, a silicon single crystal.

The Si layer 14 is comprised of, for example, silicon, and circuit elements constituting the PA control circuit 11 are formed on or over the Si layer 14.

The wiring layer 15 is implemented by, for example, forming vias 16, which transmit control signals from the PA control circuit 11 to the second base part 20 and the module substrate 91, inside of a layer comprised of silicon oxide.

The SiN layer 17 is, for example, a protective layer comprised of silicon nitride and is provided to secure the reliability of the first base part 10 in, for example, moisture resistance.

The first base part 10 is connected to the major surface 91a via electrodes 24 (second electrodes) extending from the first base part 10 toward the major surface 91a. Each of the electrodes 24 includes, for example, a columnar conductor 24a and a bump electrode 24b, one end of the columnar conductor 24a is joined to an electrode 18 formed on or in the SiN layer 17, and another end of the columnar conductor 24a is joined to the bump electrode 24b. The bump electrode 24b is connected to an electrode formed on the major surface 91a.

This enables the electronic circuit in the first base part 10 to exchange radio frequency signals and digital signals directly with the module substrate 91 and thereby makes it possible to reduce signal transmission loss.

Here, as long as the first base part 10 includes the Si substrate 12 and an electronic circuit, such as the PA control circuit 11, other layers may be omitted. Also, the switches 53 and 54 may be included in the first base part 10.

As illustrated in FIG. 4, the first base part 10 has a major surface 10a and a major surface 10b that face each other. The major surface 10b may be in contact with the metal shield layer 85.

This makes it possible to transfer heat generated in the power amplifier 21 of the second base part 20 to the outside via the first base part 10 and the metal shield layer 85. Accordingly, the heat dissipation of the radio frequency module 1A is improved.

The thermal conductivity of the first semiconductor material of the first base part 10 may be higher than the thermal conductivity of the second semiconductor material of the second base part 20.

This improves the heat dissipation from the second base part 20 to the first base part 10.

Also, a resin component 71 is disposed on the major surface 10a of the first base part 10. The resin component 71 also covers the second base part 20.

As illustrated in FIG. 5, the second base part 20 includes, for example, a GaAs base layer 20n and an epitaxial layer 20d.

The GaAs base layer 20n is, for example, a single-crystal substrate comprised of gallium arsenide.

The epitaxial layer 20d is formed by, for example, epitaxially growing GaAs on the GaAs base layer 20n.

The power amplifier 21 is formed on, for example, the epitaxial layer 20d.

The GaAs base layer 20n is joined to the SiN layer 17 of the first base part 10. In other words, the second base part 20 is joined to the first base part 10.

The power amplifier 21 includes amplification transistors, and each of the amplification transistors includes a collector layer 21C, a base layer 21B, and an emitter layer 21E. The collector layer 21C, the base layer 21B and the emitter layer 21E are stacked in this order on the epitaxial layer 20d. That is, in each of the amplification transistors, the collector layer

21C, the base layer 21B, and the emitter layer 21E are stacked in this order from the side closer to the first base part 10.

The second base part 20 is connected to the major surface 91a via an electrode 23 (first electrode) extending from the second base part 20 toward the major surface 91a. The electrode 23 includes, for example, a columnar conductor 23a and a bump electrode 23b, one end of the columnar conductor 23a is joined to an electrode 22 formed on the major surface of the second base part 20, and another end of the columnar conductor 23a is joined to the bump electrode 23b. The bump electrode 23b is connected to an electrode formed on the major surface 91a.

This configuration enables the amplifier circuit of the second base part 20 to exchange signals directly with the module substrate 91 and thereby makes it possible to reduce signal transmission loss.

The amplifier circuit of the second base part 20 may also receive, for example, digital control signals and direct-current signals from the electronic circuit of the first base part 10 through the vias 16.

Also, as illustrated in FIG. 4, the second base part 20 may be thinner than the first base part 10. In other words, the thickness of the second base part 20 in the thickness direction (z-axis direction) may be less than the thickness the first base part 10 in the thickness direction (z-axis direction).

With this configuration, because the second base part 20 with low thermal conductivity is relatively thin and the first base part 10 with high thermal conductivity is relatively thick, the heat conduction from the second base part 20 to the first base part 10 is facilitated and the heat dissipation is improved.

As illustrated in FIGS. 3 and 4, in plan view of the module substrate 91, the second base part 20 does not extend beyond the outer edge of the first base part 10. In other words, the area of the second base part 20 is less than the area of the first base part 10 in plan view.

Referring back to FIGS. 2A, 2B, and 3, the layout of the radio frequency module 1A according to the first example is further described.

The radio frequency module 1A further includes a via conductor 91V that is formed in the module substrate 91 and connects the major surfaces 91a and 91b to each other. One end of the via conductor 91V is connected, at the major surface 91a, to a ground electrode of the power amplifier 21; and another end of the via conductor 91V is connected, at the major surface 91b, to external connection terminals 150t that are among the external connection terminals 150 and set at the ground potential.

The power amplifier 21 is a circuit component that generates the highest amount of heat among the circuit components constituting the radio frequency module 1A. To improve the heat dissipation of the radio frequency module 1A, it is suitable to transfer heat generated by the power amplifier 21 to the external substrate via a heat dissipation path with a small thermal resistance. If the power amplifier 21 is mounted on or over the major surface 91b, an electrode wire connected to the power amplifier 21 is disposed on the major surface 91b. In this case, the heat dissipation path includes a heat dissipation path that passes through only a planar wiring pattern on the major surface 91b (along the xy-plane direction). The planar wiring pattern is formed of a metal thin film and therefore has a high thermal resistance. For this reason, when the power amplifier 21 is disposed on the major surface 91b, the heat dissipation is reduced.

In contrast, as illustrated in FIG. 3, the radio frequency module 1A according to this example further includes the via conductor 91V that is connected, at the major surface 91a, to the ground electrode of the power amplifier 21 and extends from the major surface 91a to the major surface 91b. The via conductor 91V is also connected, at the major surface 91b, to the external connection terminals 150t that are set at the ground potential.

This configuration makes it possible to connect the power amplifier 21 to the external connection terminals 150t by way of the via conductor 91V for heat dissipation. This in turn makes it possible to exclude, as a heat dissipation path for the power amplifier 21, a heat dissipation path passing through only the planar wiring pattern that extends along the xy-plane direction and has a high thermal resistance among wiring in the module substrate 91. This also makes it possible to provide a small radio frequency module 1A with improved heat dissipation from the power amplifier 21 to the external substrate.

In the radio frequency module 1A according to this example, the switches 51 and 52 are included in a semiconductor IC 75. This makes it possible to reduce the size of the radio frequency module 1A.

Also, in the radio frequency module 1A according to this example, the low-noise amplifier 31 and the switches 53 and 54 are included in a semiconductor IC 76. This makes it possible to reduce the size of the radio frequency module 1A.

In the radio frequency module 1A according to this example, in plan view of the module substrate 91, the semiconductor IC 70 and the low-noise amplifier 31 do not overlap each other.

With this configuration, the power amplifier 21 and the low-noise amplifier 31 are distributed to the two sides of the module substrate 91, and the power amplifier 21 and the low-noise amplifier 31 can be separated by a large distance. This in turn makes it possible to improve the isolation between transmission and reception.

In the radio frequency module 1A according to this example, the matching circuit 43 (second impedance matching circuit) connected to the input terminal of the low-noise amplifier 31 is disposed on or over the major surface 91a, and the matching circuit 42 (first impedance matching circuit) connected to the output terminal of the power amplifier 21 is disposed on or over the major surface 91b.

This configuration makes it possible to suppress magnetic field coupling between the inductor of the matching circuit 43 and the inductor of the matching circuit 42 and thereby makes it possible to improve the isolation between transmission and reception.

Figures 6A, 6B:
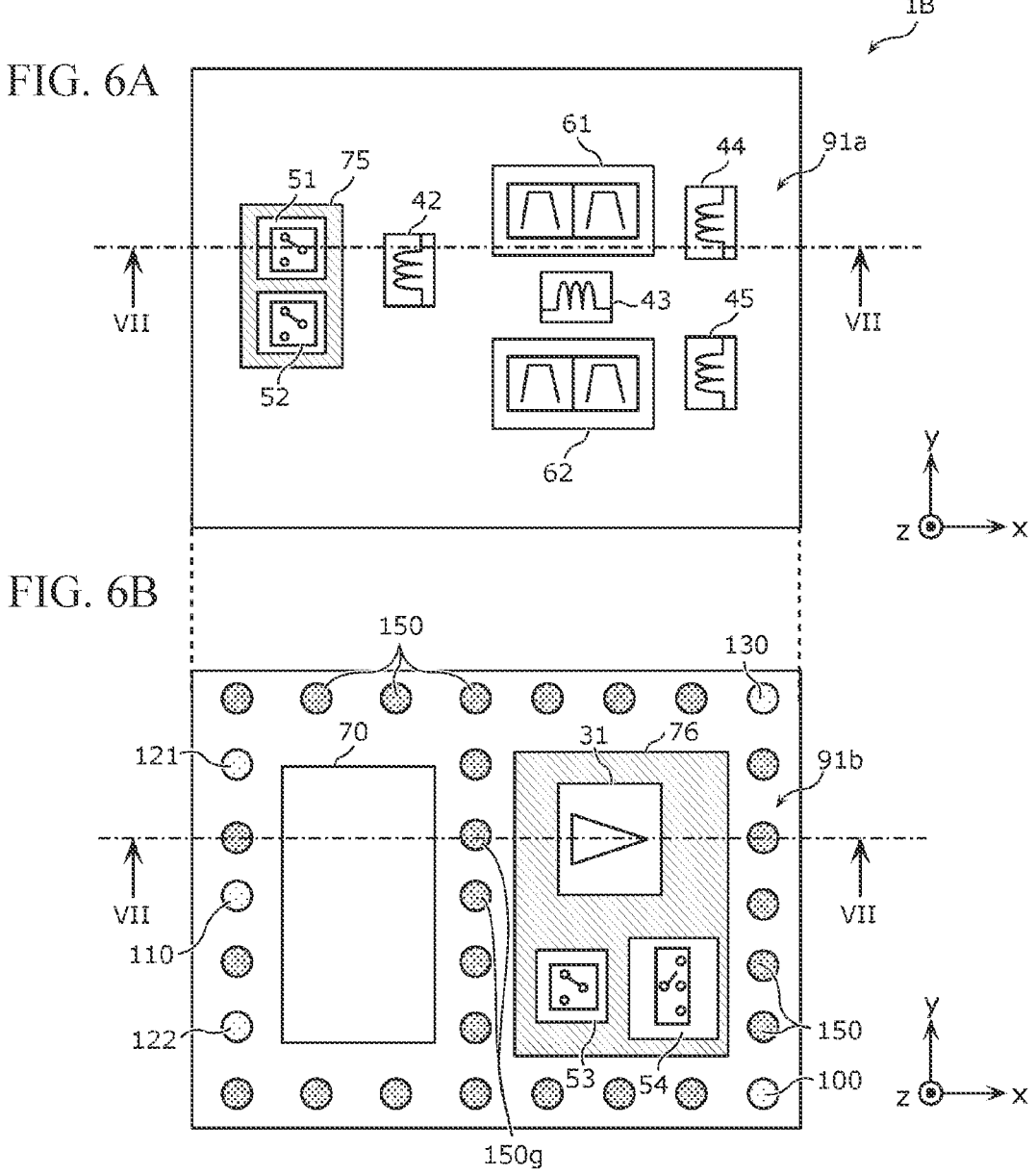
FIG. 6A is a plan-view schematic diagram of a major surface of a radio frequency module according to a second example viewed from the positive z-axis direction.
FIG. 6B is a transparent view of another major surface of the radio frequency module according to the second example when the another major surface is viewed from the positive z-axis direction.
Figure 7:
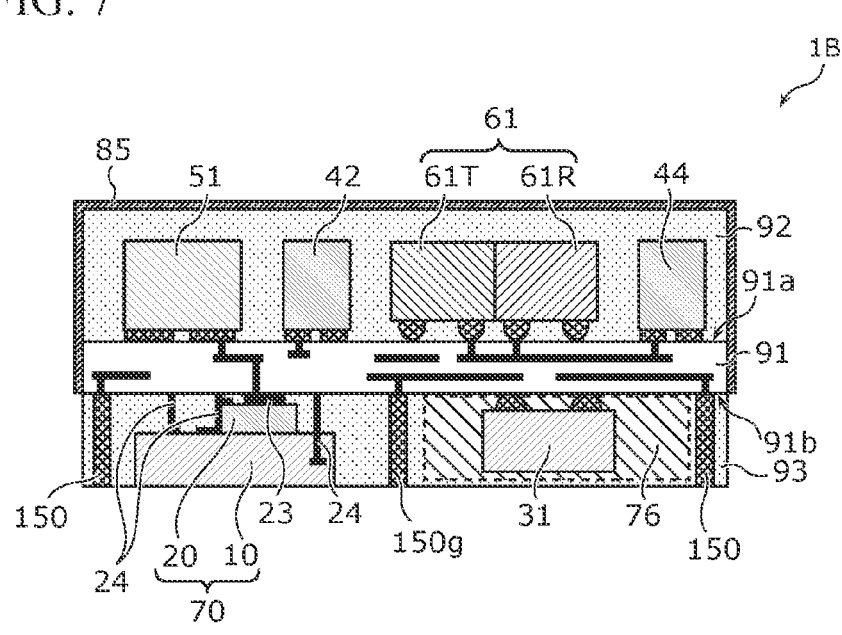
FIG. 7 is a cross-sectional schematic diagram of the radio frequency module according to the second example.
Figure 7:
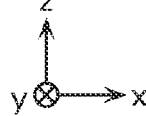

3. Layout of Circuit Elements of Radio Frequency Module 1B According to Second Example FIG. 6A is a plan-view schematic diagram of a radio frequency module 1B according to a second example. FIG. 6B is a transparent view of another major surface of the radio frequency module according to the second example when the another major surface is viewed from the positive z-axis direction. FIG. 7 is a cross-sectional schematic diagram of the radio frequency module 1B according to the second example and is specifically a cross-sectional view taken along line VII-VII of FIGS. 6A and 6B. Out of the major surface 91a and the major surface 91b of the module substrate 91 that face each other, FIG. 6A illustrates a layout of circuit components when the major surface 91a is viewed from the positive z-axis direction. On the other hand, FIG. 6B is a transparent view of the layout of circuit components when the major surface 91b is viewed from the positive z-axis direction. Although circuit components in FIGS. 6A and 6B are provided with symbols representing their functions to facilitate the understanding of the layout of the circuit components, such symbols are not provided in the actual radio frequency module 1B.

The radio frequency module 1B according to the second example shows a specific example of the layout of circuit elements constituting the radio frequency module 1 according to the embodiment.

As illustrated in FIGS. 6 and 7, the radio frequency module 1B according to this example includes, in addition to the circuit configuration illustrated in FIG. 1, the module substrate 91, the resin components 92 and 93, the external connection terminals 150, the metal shield layer 85, and the semiconductor IC 70.

The radio frequency module 1B of this example differs from the radio frequency module 1A of the first example only in the layout of the semiconductor IC 70, the switches 51 and 52, and the matching circuit 42. Below, regarding the radio frequency module 1B of this example, descriptions of configurations that are the same as those of the radio frequency module 1A of the first example are omitted, and configurations different from those of the radio frequency module 1A are mainly described.

The module substrate 91 has the major surface 91a and the major surface 91b that face each other, and circuit components constituting the radio frequency module 1B are mounted on or over the module substrate 91. In this example, the major surface 91a corresponds to a second major surface, and the major surface 91b corresponds to a first major surface.

As illustrated in FIGS. 6 and 7, in the radio frequency module 1B according to this example, the switches 51 and 52, the duplexers 61 and 62, the matching circuits 42, 43, 44, and 45 are disposed on or over the major surface 91a. On the other hand, the semiconductor IC 70, the low-noise amplifier 31, and the switches 53 and 54 are disposed on or over the major surface 91b.

Also, in the radio frequency module 1B according to this example, multiple external connection terminals 150 are arranged on the major surface 91b.

In the radio frequency module 1B according to this example, it is suitable that the semiconductor IC 70 be disposed on or over the major surface 91b and at least one of the switches 51 and 52 be disposed on or over the major surface 91a, whereas other circuit components may be disposed on either one of the major surfaces 91a and 91b.

As illustrated in FIG. 7, the second base part 20 is disposed between the module substrate 91 and the first base part 10, is joined to the first base part 10, and is connected to the major surface 91b via the electrode 23.

With the above configuration, the semiconductor IC 70 is disposed on or over the major surface 91b, and the switches 51 and 52 are disposed on or over the major surface 91a. With this configuration, the circuit components constituting the radio frequency module 1B are distributed to the two sides of the module substrate 91 and therefore, the size of the radio frequency module 1B can be reduced.

As illustrated in FIGS. 6 and 7, in plan view of the module substrate 91, the semiconductor IC 70 and the switches 51 and 52 at least partially overlap each other.

Compared with a configuration in which the semiconductor IC 70 and the switches 51 and 52 are disposed on or over the same major surface of the module substrate 91, the above configuration makes it possible to shorten control wiring connecting the PA control circuit 11 formed in the first base part 10 to the switches 51 and 52 and to shorten transmission signal wiring connecting the power amplifier 21 to the switches 51 and 52, and thereby makes it possible to reduce the transmission loss of transmission signals and control signals.

At least one of the first base part 10 and the second base part 20 may overlap at least one of the switches 51 and 52. This makes it possible to shorten at least one of the control wiring and the transmission signal wiring and thereby makes it possible to reduce the transmission loss in the radio frequency module 1B.

In the radio frequency module 1B according to this example, in plan view of the module substrate 91, ground terminals 150g are disposed on the major surface 91b between the semiconductor IC 70 and the low-noise amplifier 31.

The ground terminals 150g are terminals that are among the external connection terminals 150 and are set at the ground potential. Each of the ground terminals 150g may be a columnar electrode that passes through the resin component 93 in the z-axis direction or a bump electrode formed on the major surface 91b.

With this configuration, because the ground terminals 150g are disposed between the semiconductor IC 70, which includes the power amplifier 21, and the low-noise amplifier 31, the isolation between transmission and reception is improved.

4. Effects

As described above, each of the radio frequency module 1A according to the first example and the radio frequency module 1B according to the second example includes the module substrate 91 having the major surfaces 91a and 91b that face each other; the first base part 10 that is at least partially comprised of the first semiconductor material and in which the electronic circuit is formed; the second base part 20 that is at least partially comprised of the second semiconductor material different from the first semiconductor material and in which the power amplifier 21 is formed; and the switch 51 connected to the input terminal of the power amplifier 21 or the switch 52 connected to the output terminal of the power amplifier 21. The first base part 10 is disposed on or over one of the major surfaces 91a and 91b; the second base part 20 is disposed between the module substrate 91 and the first base part 10, is joined to the first base part 10, and is connected to one of the major surfaces 91a and 91b via the electrode 23; and the switch 51 or 52 is disposed on or over the other one of the major surfaces 91a and 91b.

With this configuration, the first base part 10 and the second base part 20 are disposed on or over the major surface 91a, and the switch 51 or 52 is disposed on or over the major surface 91b. Because the first base part 10, the second base part 20, and the switch 51 or 52 are distributed to two sides of the module substrate 91, this configuration makes it possible to reduce the sizes of the radio frequency modules 1A and 1B. Accordingly, the above configuration makes it possible to provide reduced-size, multiband radio frequency modules 1A and 1B.

Also, in the radio frequency module 1A according to the first example and the radio frequency module 1B according to the second example, the first base part 10 may be at least partially comprised of silicon or gallium nitride, and the second base part may be at least partially comprised of gallium arsenide or silicon germanium.

Also, in the radio frequency module 1A according to the first example and the radio frequency module 1B according to the second example, in plan view of the module substrate 91, at least one of the first base part 10 and the second base part 20 may at least partially overlap the switch 51 or 52.

Compared with a configuration in which the first base part 10, the second base part 20, and the switches 51 and 52 are disposed on or over the same major surface of the module substrate 91, the above configuration makes it possible to shorten control wiring connecting the PA control circuit 11 formed in the first base part 10 to the switches 51 and 52 and to shorten transmission signal wiring connecting the power amplifier 21 to the switches 51 and 52, and thereby makes it possible to reduce the transmission loss of transmission signals and control signals.

Each of the radio frequency module 1A according to the first example and the radio frequency module 1B according to the second example may further include the transmission filter 61T with a pass band that is at least a part of the transmission band of the communication band A and the transmission filter 62T with a pass band that is at least a part of the transmission band of the communication band B; and the switch 52 is connected between the output terminal of the power amplifier 21 and the transmission filters 61T and 62T and may be configured to select one of the connection between the output terminal and the transmission filter 61T and the connection between the output terminal and the transmission filter 62T.

Also, in the radio frequency module 1A according to the first example and the radio frequency module 1B according to the second example, the switch 51 may be connected to the input terminal of the power amplifier 21 and configured to connect and disconnect the transmission input terminal 121, to which a transmission signal is input, to and from the input terminal.

In the radio frequency module 1A according to the first example and the radio frequency module 1B according to the second example, the thermal conductivity of the first semiconductor material may be higher than the thermal conductivity of the second semiconductor material.

This configuration improves the heat dissipation from the second base part 20 to the first base part 10.

In the radio frequency module 1A according to the first example and the radio frequency module 1B according to the second example, the first base part 10 may be connected to one of the major surfaces 91a and 91b via an electrode 24.

This enables the electronic circuit in the first base part 10 to exchange radio frequency signals and digital signals directly with the module substrate 91 and thereby makes it possible to reduce signal transmission loss.

In the radio frequency module 1A according to the first example and the radio frequency module 1B according to the second example, the power amplifier 21 may include amplification transistors each of which includes the collector layer 21C, the base layer 21B, and the emitter layer 21E; and the collector layer 21C, the base layer 21B, and the emitter layer 21E may be stacked in this order from the side closer to the first base part 10.

In the radio frequency module 1A according to the first example and the radio frequency module 1B according to the second example, the electronic circuit may include the PA control circuit 11 that controls the power amplifier 21.

This makes it possible to shorten control wiring connecting the power amplifier 21 to the PA control circuit 11.

Also, each of the radio frequency module 1A according to the first example and the radio frequency module 1B according to the second example may further include multiple external connection terminals 150 disposed on the major surface 91b.

The radio frequency module 1A according to the first example may further include the via conductor 91V that is formed in the module substrate 91 and connects the major surfaces 91a and 91b to each other; one end of the via conductor 91V may be connected, at the major surface 91a, to the ground electrode of the power amplifier 21; and the other end of the via conductor 91V may be connected, at the major surface 91b, to the external connection terminals 150t that are among the external connection terminals 150 and set at the ground potential.

This configuration makes it possible to exclude, as a heat dissipation path for the power amplifier 21, a heat dissipation path passing through only the planar wiring pattern that extends along the xy-plane direction and has a high thermal resistance among wiring in the module substrate 91. This in turn makes it possible to provide a small radio frequency module 1A with improved heat dissipation from the power amplifier 21 to the external substrate.

In the radio frequency module 1A according to the first example and the radio frequency module 1B according to the second example, the switches 51 and 52 may be included in the semiconductor IC 75.

This makes it possible to reduce the sizes of the radio frequency modules 1A and 1B.

The radio frequency module 1A according to the first example may further include the low-noise amplifier 31 disposed on or over the major surface 91b; and in plan view of the module substrate 91, the first base part 10 and the second base part 20 may not necessarily overlap the low-noise amplifier 31.

With this configuration, the power amplifier 21 and the low-noise amplifier 31 are distributed to the two sides of the module substrate 91, and the power amplifier 21 and the low-noise amplifier 31 can be separated by a large distance. This in turn makes it possible to improve the isolation between transmission and reception.

The radio frequency module 1A according to the first example may further include the matching circuit 42 connected to the output terminal of the power amplifier 21 and disposed on or over the major surface 91b, and the matching circuit 43 connected to the input terminal of the low-noise amplifier 31 and disposed on or over the major surface 91a.

This configuration makes it possible to suppress magnetic field coupling between the inductor of the matching circuit 43 and the inductor of the matching circuit 42 and thereby makes it possible to improve the isolation between transmission and reception.

In the radio frequency module 1B according to the second example, in plan view of the module substrate 91, the ground terminals 150g may be disposed on the major surface 91b between each of the first base part 10 and the second base part 20 and the low-noise amplifier 31.

This makes it possible to improve the isolation between transmission and reception.

The communication device 5 includes the RFIC 3 that processes radio frequency signals transmitted and received via the antenna 2 and the radio frequency module 1 that transmits the radio frequency signals between the antenna 2 and the RFIC 3.

This configuration makes it possible to provide a reduced-size, multiband communication device 5.

Other Embodiments

A radio frequency module and a communication device according to the embodiment of the present disclosure are described above using the embodiment and the examples.

However, the radio frequency module and the communication device according to the present disclosure are not limited to those described in the embodiment and the examples. Other embodiments implemented by combining components in the above embodiment and examples, variations obtained by applying various modifications conceivable by a person skilled in the art to the above embodiment and examples without necessarily departing from the spirit of the present disclosure, and various devices including the radio frequency module and the communication device described above are also included in the present disclosure.

For example, in the radio frequency module and the communication device according to the above embodiment and its examples, additional circuit elements and wires may be inserted in paths connecting circuit elements and signal paths illustrated in the drawings.

INDUSTRIAL APPLICABILITY

The present disclosure can be widely used for communication devices, such as a mobile phone, as a radio frequency module disposed in a multiband front-end unit.

REFERENCE SIGNS LIST 1, 1A, 1B radio frequency module
2 antenna
3 RF signal processing circuit (RFIC)
4 baseband signal processing circuit (BBIC)
5 communication device
10 first base part
10a, 10b, 91a, 91b major surface
11 PA control circuit
12 Si substrate
13 insulating layer
14 Si layer
15 wiring layer
16 via
17 SiN layer
18, 22, 23, 24 electrode
20 second base part
20d epitaxial layer
20n GaAs base layer
21 power amplifier
21B base layer
21C collector layer
21E emitter layer
23a, 24a columnar conductor
23b, 24b bump electrode
31 low-noise amplifier
42, 43, 44, 45 matching circuit
51, 52, 53, 54 switch
61, 62 duplexer
61R, 62R reception filter
61T, 62T transmission filter
70, 75, 76 semiconductor IC
71, 92, 93 resin component
85 metal shield layer
91 module substrate
91V via conductor
100 antenna connection terminal
110 control signal terminal
121, 122 transmission input terminal
130 reception output terminal
150, 150t external connection terminal
150g ground terminal

The invention claimed is:

1. A radio frequency module comprising:
a module substrate having a first major surface and a
second major surface that face each other;
a first base that at least partially comprises a first semi-
conductor material, and in which an electronic circuit is
formed;
a second base that at least partially comprises a second
semiconductor material different from the first semi-
conductor material, and in which a power amplifier is
formed; and
a first switch connected to an input terminal or an output
terminal of the power amplifier,
wherein the first base is on or over the first major surface;
the second base is between the module substrate and the
first base, is joined to the first base, and is connected to
the first major surface via a first electrode; and
the first switch is on or over the second major surface.
2. The radio frequency module according to claim 1,
wherein the first semiconductor material is silicon or
gallium nitride,
wherein the second semiconductor material is gallium
arsenide or silicon germanium, and
wherein the first base and the second base are on or over
the first major surface.
3. The radio frequency module according to claim 1,
wherein in a plan view of the module substrate, the first base
or the second base at least partially overlaps the first switch.
4. The radio frequency module according to claim 1,
further comprising:
a first transmission filter with a pass band that comprises
at least a part of a transmission band of a first com-
munication band; and
a second transmission filter with a pass band that com-
prises at least a part of a transmission band of a second
communication band,
wherein the first switch is connected between the output
terminal and each of the first transmission filter and the
second transmission filter, and is configured to switch
connection of the output terminal between the first
transmission filter and the second transmission filter.
5. The radio frequency module according to claim 1,
wherein the first switch is connected to the input terminal,
and is configured to selectively connect and disconnect a
transmission input terminal to and from the input terminal,
a transmission signal being input to the input terminal.
6. The radio frequency module according to claim 1,
wherein a thermal conductivity of the first semiconductor
material is greater than a thermal conductivity of the second
semiconductor material.
7. The radio frequency module according to claim 1,
wherein the first base is connected to the first major surface
via a second electrode.
8. The radio frequency module according to claim 1,
wherein the power amplifier comprises an amplification
transistor comprising a collector layer, a base layer, and
an emitter layer; and
the collector layer, the base layer, and the emitter layer are
stacked, the base layer being between the collector layer and the emitter layer, and the collector layer being
closer to the first base than the base layer and the
emitter layer.
9. The radio frequency module according to claim 1,
wherein the electronic circuit comprises a control circuit
configured to control the power amplifier.
10. The radio frequency module according to claim 1,
further comprising:
multiple external connection terminals that are on the
second major surface.
11. The radio frequency module according to claim 10,
further comprising:
a via conductor that is in the module substrate and that
connects the first major surface to the second major
surface,
wherein a first end of the via conductor is connected to a
ground electrode of the power amplifier at the first
major surface, and
wherein a second end of the via conductor is connected to
one of the multiple external connection terminals at the
second major surface, the one of the multiple external
connection terminals being at a ground potential.
12. The radio frequency module according to claim 10,
wherein the first switch is in a semiconductor integrated
circuit (IC).
13. The radio frequency module according to claim 10,
further comprising:
a low-noise amplifier on or over the second major surface,
wherein in a plan view of the module substrate, the first
base and the second base do not overlap the low-noise
amplifier.
14. The radio frequency module according to claim 13,
further comprising:
a first impedance matching circuit that is connected to the
output terminal and that is on or over the second major
surface; and
a second impedance matching circuit that is connected to
an input terminal of the low-noise amplifier and that is
on or over the first major surface.
15. The radio frequency module according to claim 1,
further comprising:
multiple external connection terminals on the first major
surface.
16. The radio frequency module according to claim 15,
further comprising:
a low-noise amplifier on or over the first major surface,
wherein in a plan view of the module substrate, a ground
terminal is on the first major surface between each of
the first base and the second base and the low-noise
amplifier.
17. A communication device comprising:
a radio frequency (RF) signal processing circuit that is
configured to process a radio frequency signal trans-
mitted via an antenna; and
the radio frequency module according to claim 1 that is
configured to transmit the radio frequency signal
between the antenna and the RF signal processing
circuit.

* * * * *